(12) United States Patent
Sevel et al.

(10) Patent No.: US 11,275,107 B2
(45) Date of Patent: Mar. 15, 2022

(54) METHOD AND APPARATUS FOR MONITORING ISOLATION OF AN ELECTRIC POWER BUS

(71) Applicant: GM GLOBAL TECHNOLOGY OPERATIONS LLC, Detroit, MI (US)

(72) Inventors: Kris Sevel, Rochester Hills, MI (US); Yue Fan, Troy, MI (US); Emil Francu, Northville, MI (US); Konking Wang, Canton, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 154 days.

(21) Appl. No.: 16/709,501

(22) Filed: Dec. 10, 2019

(65) Prior Publication Data

US 2021/0172996 A1   Jun. 10, 2021

(51) Int. Cl.
*G01R 31/28* (2006.01)
*B60L 3/00* (2019.01)
*G01R 31/00* (2006.01)
*G01R 27/02* (2006.01)

(52) U.S. Cl.
CPC .......... *G01R 31/281* (2013.01); *B60L 3/0069* (2013.01); *G01R 27/025* (2013.01); *G01R 31/007* (2013.01)

(58) Field of Classification Search
USPC ........................................ 324/503, 504, 509
See application file for complete search history.

(56) References Cited

U.S. PATENT DOCUMENTS

2011/0218745 A1   9/2011   Hasan et al.
2016/0245853 A1*  8/2016   Weiss .................... G01R 31/42

OTHER PUBLICATIONS

Automotive High-Voltage and Isolation Leakage Measurements Reference Design; TI Designs: TIDA-01513; TIDUDJ6—Apr. 2018.

\* cited by examiner

*Primary Examiner* — Vincent Q Nguyen
(74) *Attorney, Agent, or Firm* — Quinn IP Law

(57) ABSTRACT

Dynamically monitoring of an electrically-isolated power bus for a DC power system is described, and includes dynamically monitoring voltage and current on the power bus to determine a variation in the voltage on the power bus. When the variation in the voltage on the power bus is less than a threshold, an active positive isolation resistance term and an active negative isolation resistance term are determined. A first voltage balance term is determined based upon a ratio of the active positive isolation resistance term and the active negative isolation resistance term. A dynamic positive isolation resistance term and a dynamic negative isolation resistance term are determined based upon the active negative isolation resistance term. A fault associated with the power bus is determined based upon the dynamic positive isolation resistance term and the dynamic negative isolation resistance term.

20 Claims, 2 Drawing Sheets

METHOD AND APPARATUS FOR MONITORING ISOLATION OF AN ELECTRIC POWER BUS

INTRODUCTION

Electric power systems may employ power buses to transfer electric power between a storage device, e.g., a DC power source, and a load, with the power bus and DC power source being electrically isolated from an electrical ground. Examples of such an arrangement include electro-mechanical hybrid vehicle systems and electric vehicle systems, which employ high voltage systems to provide electric power for traction motors and other electric machines. This may include a high voltage DC electric power source, e.g., a battery that electrically connects to a traction motor via a power inverter. The power inverter converts DC electric power to AC electric power to drive the traction motor, and converts AC electric power to DC electric power for charging the battery. The high voltage DC electric power source electrically connects to the power inverter via a positive power bus (HV+) and a negative power bus (HV−). Other electric machines using high voltage power may be electrically connected to the power bus, which may be electrically isolated from a chassis ground of the vehicle.

One fault associated with a system that includes a power bus includes loss of electrical isolation from a chassis ground, wherein one or both of the positive power bus (HV+) and the negative power bus (HV−) is shorted to the chassis ground or has reduced impedance relative to the chassis ground. Monitoring systems for detecting electrical isolation of a power bus may include in-use monitoring of bus voltage levels relative to the chassis ground during system operation to determine an isolation resistance parameter. Issues associated with the in-use monitoring include signal measurement errors that need to be accounted for and are often cumulative. The effect of signal measurement errors may lead to false fault detection. Furthermore, DC voltage sensors may have bandwidth and response time measurement limitations. Furthermore, the timing of a measurement sample relative to a fault and an associated load event may result in a fault not being recorded. Furthermore, fault impedance may include a resonance element, with data sampling occurring at or near zero crossing. Thus, a fault current may be aliased out. Thus, a fault voltage may not be measured. Furthermore, noise on either the positive power bus (HV+) and the negative power bus (HV−) may affect determining a fault.

Thus, there is a need for an improved system to dynamically monitor electrical ground isolation of a floating power bus in relation to a chassis ground.

SUMMARY

A method and system for dynamically monitoring an electrically-isolated power bus for a DC power system are described, wherein the power bus includes a positive power bus and a negative power bus. The method includes dynamically monitoring voltage and current on the power bus to determine a variation in the voltage on the power bus. When the variation in the voltage on the power bus is less than a threshold variation, an active positive isolation resistance term associated with the positive power bus and ground is determined, and an active negative isolation resistance term associated with the negative power bus and ground is determined. A first voltage balance term is determined based upon a ratio of the active positive isolation resistance term and the active negative isolation resistance term. A dynamic isolation resistance term, is periodically determined. This includes monitoring the voltage of the power bus, determining a voltage between the positive power bus and ground, determining a voltage between the negative power bus and ground, and determining a dynamic voltage balance term based upon a ratio of the voltage between the positive power bus and ground and the voltage between the negative power bus and ground. A dynamic positive isolation resistance term is determined based upon the active positive isolation resistance term and the dynamic voltage balance term. A dynamic negative isolation resistance term is determined based upon the active negative isolation resistance term and the dynamic voltage balance term. A fault associated with the power bus is determined based upon the dynamic positive isolation resistance term and the dynamic negative isolation resistance term.

An aspect of the disclosure includes introducing a first bias resistance element between the positive power bus and ground, determining a first voltage between the positive power bus and ground, determining the active positive isolation resistance term based upon the first bias resistance element and the first voltage between the positive power bus and ground, determining the active negative isolation resistance term based upon the resistance and the first voltage between the positive power bus and ground.

Another aspect of the disclosure includes introducing a second bias resistance element between the negative power bus and ground, and determining a second voltage between the positive power bus and ground, determining the active positive isolation resistance term based upon the second bias resistance element and the second voltage between the negative power bus and ground, and determining the active negative isolation resistance term based upon the second bias resistance element and the second voltage between the negative power bus and ground.

Another aspect of the disclosure includes determining the dynamic positive isolation resistance term to be equal to the active positive isolation resistance term when the dynamic voltage balance term is equivalent to the first voltage balance term.

Another aspect of the disclosure includes determining the dynamic negative isolation resistance term to be equal to the active negative isolation resistance term when the dynamic voltage balance term is equivalent to the first voltage balance term.

Another aspect of the disclosure includes determining the dynamic positive isolation resistance term to be equal to the active positive isolation resistance term multiplied by the dynamic voltage balance term when the dynamic voltage balance term is less than the first voltage balance term.

Another aspect of the disclosure includes determining the dynamic negative isolation resistance term to be equal to the active negative isolation resistance term when the dynamic voltage balance term is less than the first voltage balance term.

Another aspect of the disclosure includes determining the dynamic positive isolation resistance term to be equal to the active positive isolation resistance term when the dynamic voltage balance term is greater than the first voltage balance term.

Another aspect of the disclosure includes determining the dynamic negative isolation resistance term to be equal to the active negative isolation resistance term divided by the dynamic voltage balance term when the dynamic voltage balance term is greater than the first voltage balance term.

Another aspect of the disclosure includes communicating occurrence of the fault associated with the power bus to an operator via the controller.

Another aspect of the disclosure includes detecting the fault associated with the power bus when one of the dynamic positive isolation resistance term or the dynamic negative isolation resistance term is less than a minimum threshold resistance.

Another aspect of the disclosure includes determining the dynamic positive isolation resistance term based upon the active positive isolation resistance term and the dynamic voltage balance term by determining the dynamic positive isolation resistance term to be equal to the active positive isolation resistance term multiplied by a ratio of the first voltage balance term and the dynamic voltage balance term when the dynamic voltage balance term is less than the first voltage balance term.

Another aspect of the disclosure includes determining the dynamic negative isolation resistance term based upon the active negative isolation resistance term and the dynamic voltage balance term by determining the dynamic negative isolation resistance term to be equal to the active negative isolation resistance term divided by a ratio of the first voltage balance term and the dynamic voltage balance term when the dynamic voltage balance term is greater than the first voltage balance term.

The above summary is not intended to represent every possible embodiment or every aspect of the present disclosure. Rather, the foregoing summary is intended to exemplify some of the novel aspects and features disclosed herein. The above features and advantages, and other features and advantages of the present disclosure, will be readily apparent from the following detailed description of representative embodiments and modes for carrying out the present disclosure when taken in connection with the accompanying drawings and the appended claims.

BRIEF DESCRIPTION OF THE DRAWINGS

One or more embodiments will now be described, by way of example, with reference to the accompanying drawings, in which.

The appended drawings are not necessarily to scale, and may present a somewhat simplified representation of various features of the present disclosure as disclosed herein, including, for example, specific dimensions, orientations, locations, and shapes. Details associated with such features will be determined in part by the particular intended application and use environment.

DETAILED DESCRIPTION

The components of the disclosed embodiments, as described and illustrated herein, may be arranged and designed in a variety of different configurations. Thus, the following detailed description is not intended to limit the scope of the disclosure, as claimed, but is merely representative of possible embodiments thereof. In addition, while numerous specific details are set forth in the following description in order to provide a thorough understanding of the embodiments disclosed herein, some embodiments can be practiced without some of these details. Moreover, for the purpose of clarity, certain technical material that is understood in the related art has not been described in detail in order to avoid unnecessarily obscuring the disclosure. Furthermore, the disclosure, as illustrated and described herein, may be practiced in the absence of an element that is not specifically disclosed herein. The following detailed description is merely exemplary in nature and is not intended to limit the application and uses. Furthermore, there is no intention to be bound by any expressed or implied theory presented in the preceding technical field, background, brief summary or the following detailed description.

As used herein, the term "system" may refer to mechanical and electrical hardware, software, firmware, electronic control component, processing logic, and/or processor device, individually or in combination, including without limitation: application specific integrated circuit (ASIC), an electronic circuit, a processor (shared, dedicated, or group) that executes one or more software or firmware programs, memory to contain software or firmware instructions, a combinational logic circuit, and/or other components that provide the described functionality.

Figure 1:
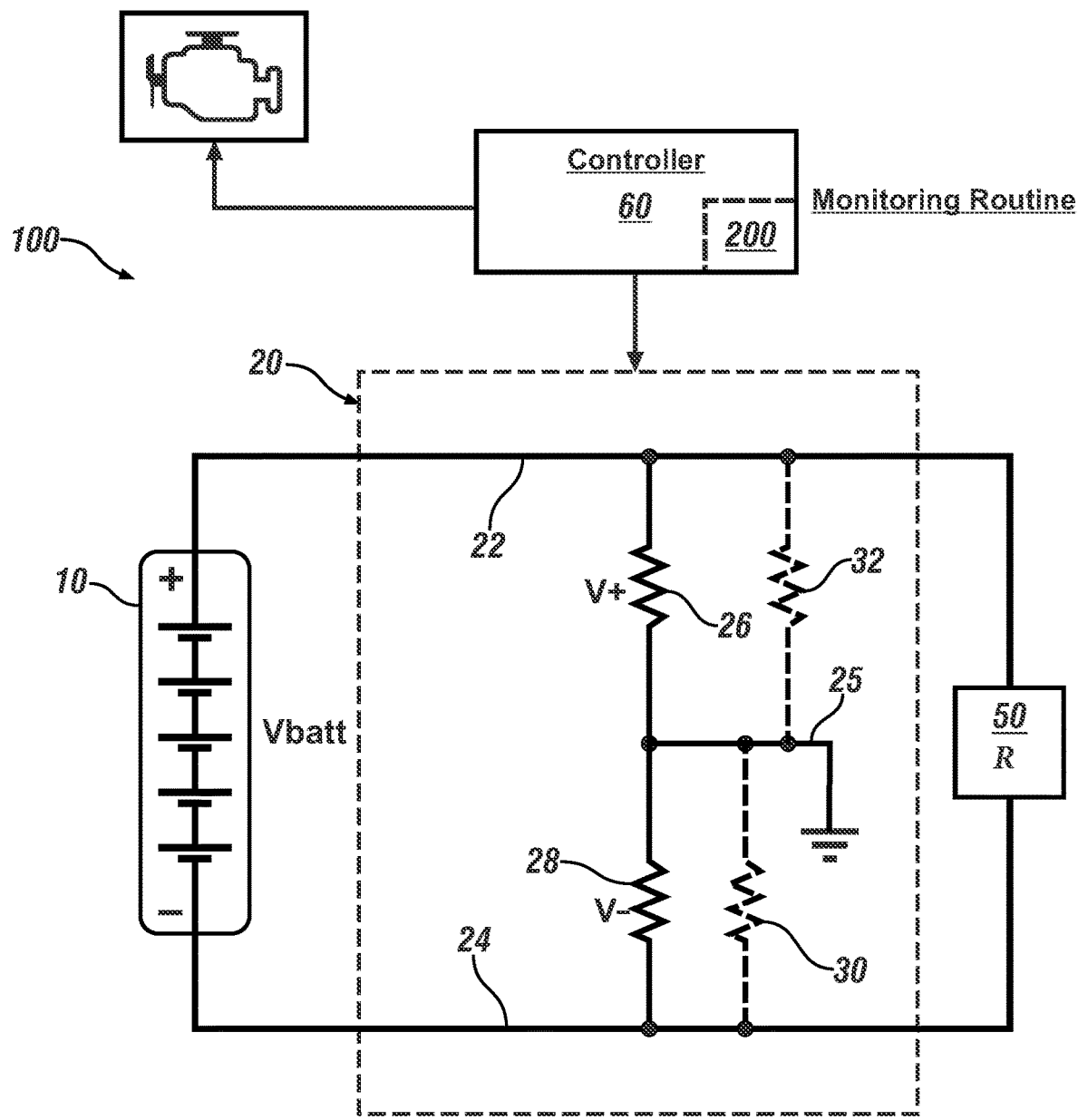
FIG. 1 schematically shows a DC power system including a DC power source that is electrically coupled to an electrically-isolated power bus to transfer DC electric power to an electric load, in accordance with the disclosure.

Referring to the drawings, wherein like reference numerals correspond to like or similar components throughout the several Figures, FIG. 1, consistent with embodiments disclosed herein, illustrates a DC power system 100, which includes a DC power source 10 that is electrically coupled to an electrically-isolated power bus 20 to transfer DC electric power to an electric load 50. In one embodiment, the DC power system 100 is disposed on a vehicle, which may include, but not be limited to a mobile platform in the form of a commercial vehicle, industrial vehicle, agricultural vehicle, passenger vehicle, aircraft, watercraft, train, all-terrain vehicle, personal movement apparatus, robot and the like to accomplish the purposes of this disclosure.

The DC power system 100 includes the DC power source 10 arranged to transfer DC electric power to the electric load 50 via the electrically-isolated power bus 20, which includes a positive power bus 22 and a negative power bus 24. The positive power bus 22 and the negative power bus 24 are electrically isolated from a chassis ground 25. The DC power source 10 and the power bus 20 are arranged in a floating arrangement, wherein the positive power bus 22 and the negative power bus 24 are arranged to float relative to the chassis ground 25. This floating may be controlled by using balanced high impedance resistors 26, 28 that connect the positive and negative power buses 22, 24, respectively, to the chassis ground 25. Capacitors (not shown) may be electrically connected in parallel with the high impedance resistors 26, 28 to provide low impedance shunt paths for high frequency electric noise currents.

Referring again to FIG. 1, in one embodiment, half the DC bus voltage is applied across the positive power bus 22 to the chassis ground 25, and half the DC bus voltage is applied across the negative power bus 24 to the chassis ground 25. A controller 60 is in communication with and/or operatively connected to the DC power source 10, the positive power bus 22, the negative power bus 24, and the electric load 50.

The DC power source 10 may be a rechargeable electrochemical battery device, a fuel cell, an ultracapacitor, or another device capable of storing and supplying potential electrical energy. The electric load 50 may include, by way of non-limiting examples, a power inverter, another DC power source, an auxiliary power module, an air conditioning compressor module, an electrical heating module, a charging module, a starter, etc. When the electric load is an inverter module, it may operate to convert DC electric power to AC electric power that is transferred to a multiphase electric machine. In one embodiment the multiphase electric machine is configured to generate torque that is transferred via a rotor to a driveline for a vehicle to generate tractive torque for vehicle propulsion. The description of the application is illustrative, and the disclosure is not restricted thereto.

The term "controller" and related terms such as microcontroller, control module, module, control, control unit, processor and similar terms refer to one or various combinations of Application Specific Integrated Circuit(s) (ASIC), Field-Programmable Gate Array (FPGA), electronic circuit(s), central processing unit(s), e.g., microprocessor(s) and associated non-transitory memory component(s) in the form of memory and storage devices (read only, programmable read only, random access, hard drive, etc.). The non-transitory memory component is capable of storing machine readable instructions in the form of one or more software or firmware programs or routines, combinational logic circuit(s), input/output circuit(s) and devices, signal conditioning and buffer circuitry and other components that can be accessed by one or more processors to provide a described functionality. Input/output circuit(s) and devices include analog/digital converters and related devices that monitor inputs from sensors, with such inputs monitored at a preset sampling frequency or in response to a triggering event. Software, firmware, programs, instructions, control routines, code, algorithms and similar terms mean controller-executable instruction sets including calibrations and look-up tables. Each controller executes control routine(s) to provide desired functions. Routines may be executed at regular intervals, for example each 100 microseconds during ongoing operation. Alternatively, routines may be executed in response to occurrence of a triggering event. Communication between controllers, actuators and/or sensors may be accomplished using a direct wired point-to-point link, a networked communication bus link, a wireless link or another suitable communication link. Communication includes exchanging data signals in suitable form, including, for example, electrical signals via a conductive medium, electromagnetic signals via air, optical signals via optical waveguides, and the like. The data signals may include discrete, analog or digitized analog signals representing inputs from sensors, actuator commands, and communication between controllers.

The term "signal" refers to a physically discernible indicator that conveys information, and may be a suitable waveform (e.g., electrical, optical, magnetic, mechanical or electromagnetic), such as DC, AC, sinusoidal-wave, triangular-wave, square-wave, vibration, and the like, that is capable of traveling through a medium.

As used herein, the terms 'dynamic' and 'dynamically' describe steps or processes that are executed in real-time and are characterized by monitoring or otherwise determining states of parameters and regularly or periodically updating the states of the parameters during execution of a routine or between iterations of execution of the routine.

The terms "calibration", "calibrated", and related terms refer to a result or a process that correlates a desired parameter and one or multiple perceived or observed parameters for a device or a system. A calibration as described herein may be reduced to a storable parametric table, a plurality of executable equations or another suitable form that may be employed as part of a measurement or control routine.

A parameter is defined as a measurable quantity that represents a physical property of a device or other element that is discernible using one or more sensors and/or a physical model. A parameter can have a discrete value, e.g., either "1" or "0", or can be infinitely variable in value.

As described with reference to FIGS. 1 and 2, a method and associated system for dynamically monitoring electrical isolation of a power bus for a DC power system includes executing an absolute isolation monitoring subroutine and a dynamic isolation monitoring subroutine. The absolute isolation monitoring subroutine may execute under limited conditions associated with stable bus voltage conditions, i.e., under conditions in which variations in the power bus voltage are less than a threshold value. The absolute isolation monitoring subroutine includes introducing a first resistance between the positive power bus and ground and determining an active positive isolation resistance term based upon the first resistance, and introducing a second resistance between the negative power bus and ground and determining an active negative isolation resistance term based upon the second resistance. The active positive isolation resistance term and the active negative isolation resistance term are absolute resistance terms. An absolute isolation resistance value may be determined as a minimum of the active positive isolation resistance term and the active negative isolation resistance term.

The dynamic isolation monitoring routine 200 may periodically execute without regard to stable bus voltage conditions, i.e., without regard to variation in the power bus voltage. As such, the dynamic isolation monitoring subroutine may execute when the variation in the power bus voltage is greater than the threshold value. The dynamic isolation monitoring subroutine periodically monitors a positive bus voltage relative to a chassis ground, and a negative bus voltage relative to a chassis ground to determine a dynamic voltage balance based upon a ratio of the positive bus voltage and the negative bus voltage. A dynamic isolation resistance term is determined based upon the absolute isolation resistance value and voltage balance terms. A fault associated with the power bus is detectable based upon the absolute isolation resistance value and the dynamic isolation resistance term.

Figure 2:
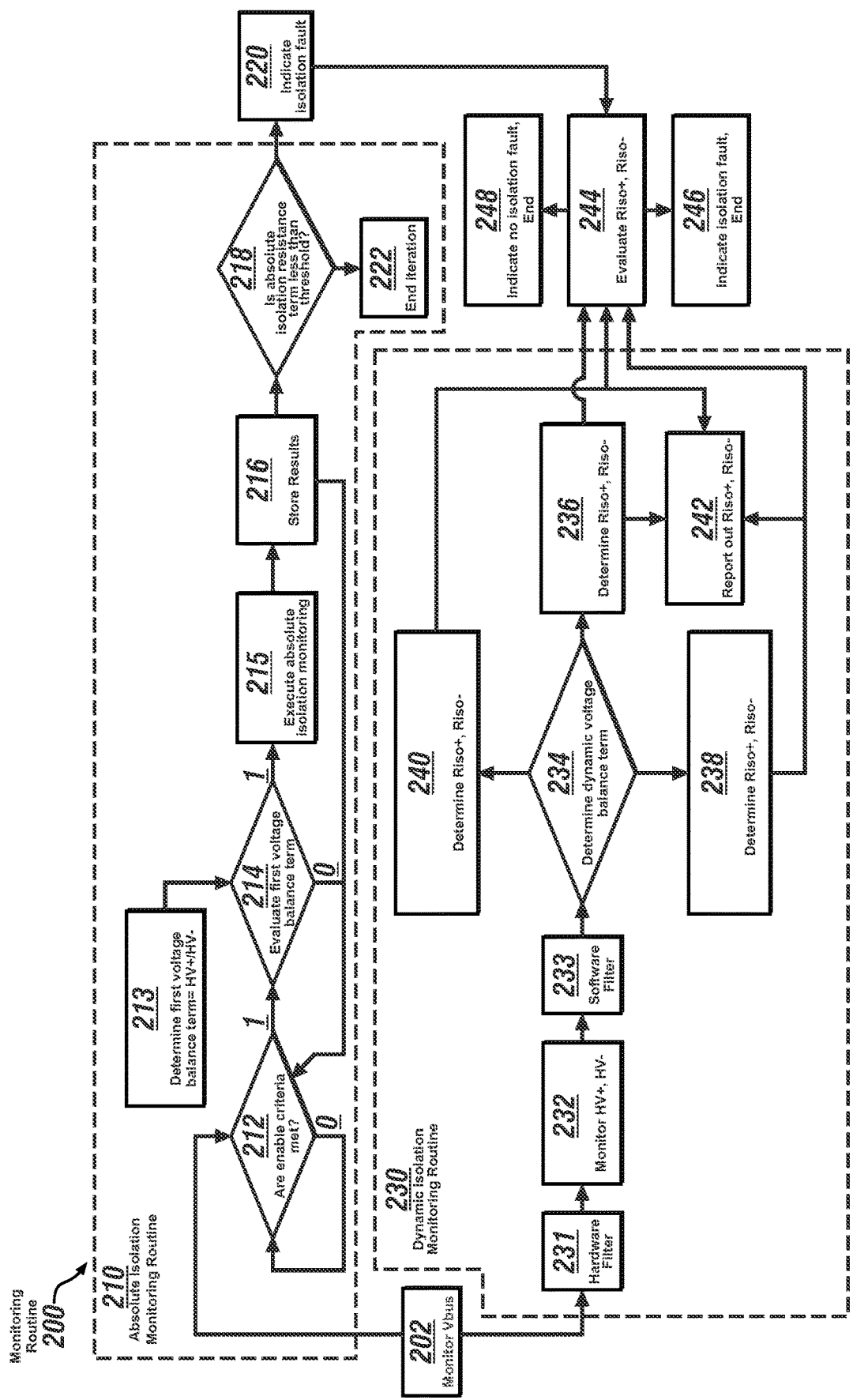
FIG. 2 schematically shows a flowchart for an isolation monitoring routine to dynamically monitor and evaluate an electrically-isolated power bus for an on-vehicle system, in accordance with the disclosure.

FIG. 2 schematically illustrates an embodiment of the isolation monitoring routine 200 for dynamically monitoring and evaluating an embodiment of the electrically-isolated power bus 20 for the DC power system 100 that is described with reference to FIG. 1. The isolation monitoring routine 200 is illustrated as a collection of functional and/or logical block components and/or various processing steps in a logical flow graph. The logical flow graph represents a sequence of operations that can be implemented in hardware, software, or a combination thereof. In the context of software, the blocks represent computer instructions that, when executed by one or more processors, perform the recited operations. It should be realized that such block components may be composed of hardware, software, and/or firmware components that have been configured to perform the specified functions. Table 1 is provided as a key for FIG. 2, wherein the numerically labeled blocks and the corresponding functions are set forth as follows, corresponding to the isolation monitoring routine 200.

TABLE 1

| BLOCK | BLOCK CONTENTS |
|---|---|
| 200 | Isolation Monitoring Routine |
| 202 | Monitor Vbus |
| 210 | Absolute Isolation Monitoring Routine |
| 212 | Are enable criteria met? |
| 213 | Determine first voltage balance term = HV+/HV− |
| 214 | Evaluate first voltage balance term |
| 215 | Execute absolute isolation monitoring to determine isolation resistance terms |
| 216 | Store Results |
| 218 | Is absolute isolation resistance term less than threshold? |
| 220 | Indicate isolation fault |
| 222 | End iteration and continue |
| 230 | Dynamic Isolation Monitoring Routine |
| 231 | Hardware Filter |
| 232 | Monitor HV+, HV− |
| 233 | Software Filter |
| 234 | Determine and evaluate dynamic voltage balance term |
| 236 | Determine dynamic isolation resistance terms Riso+, Riso− |
| 238 | Determine dynamic isolation resistance terms Riso+, Riso− |
| 240 | Determine dynamic isolation resistance terms Riso+, Riso− |
| 242 | Report out Riso+, Riso− |
| 244 | Evaluate Riso+, Riso− |
| 246 | Indicate isolation fault, End iteration |
| 248 | Indicate no isolation fault, End iteration |

Execution of the isolation monitoring routine 200 may proceed as follows. The steps of the isolation monitoring routine 200 may be executed in a suitable order, and are not limited to the order described with reference to FIG. 2. As employed herein, the term "1" indicates an answer in the affirmative, or "YES", and the term "0" indicates an answer in the negative, or "NO".

Each iteration of the isolation monitoring routine 200 includes dynamically monitoring voltage and current on the power bus 20 (Vbus) (202). This includes monitoring the voltage on the positive power bus 22 in relation to the chassis ground 25 to determine a positive bus voltage, and monitoring the voltage on the negative power bus 24 in relation to the chassis ground 25 to determine a negative bus voltage. The positive bus voltage and the negative bus voltage are evaluated to determine whether to execute an absolute isolation monitoring subroutine 210. The positive bus voltage and the negative bus voltage are also employed when periodically executing a dynamic isolation monitoring subroutine 230.

The absolute isolation monitoring subroutine 210 executes under limited conditions associated with stable power bus voltage conditions, i.e., under conditions in which variations in the positive bus voltage and the negative bus voltage are less than a threshold value (212). The power bus voltage conditions may fluctuate in response to changing load that is introduced by the electric load 50. Such change in the load introduced by the electric load 50 may include, by way of non-limiting examples, a change in an operator torque request, a change in an air conditioning load demand, etc.

When the variations in the positive bus voltage and the negative bus voltage are less than a threshold value (212)(1), the absolute isolation monitoring subroutine 210 proceeds to the next step (214). Otherwise (212)(0), monitoring of the power bus voltage conditions returns to step (212).

When executing the absolute isolation monitoring subroutine 210, enable criteria are evaluated, and include determining a first voltage balance term, which is a ratio of the positive bus voltage and the negative bus voltage (213). When the first voltage balance term is less than 0.4, or greater than 2.5, an imbalance is indicated (214)(0), and the conditions continue to be monitored without further action in the isolation monitoring routine 200.

When the first voltage balance term is greater than 0.4, or less than 2.5, a balance is indicated (214)(1), and operation continues by performing an absolute isolation detection evaluation (215).

The absolute isolation detection evaluation (215) includes introducing a first bias resistance element 32 between the positive power bus 22 and chassis ground 25, monitoring a first voltage across the first bias resistance element 32, and determining an active positive isolation resistance term based upon the voltage across the first resistance element. In one embodiment, the first resistance element has an impedance value of 6 Megohm. This includes determining a first voltage between the positive power bus and ground, and determining the active positive isolation resistance term based upon the first bias resistance element and the first voltage between the positive power bus and ground; and determining the active negative isolation resistance term based upon the resistance and the first voltage between the positive power bus and ground.

Alternatively, the absolute isolation detection evaluation (215) includes introducing a second bias resistance element 30 between the negative power bus 24 and chassis ground 25, monitoring a second voltage across the second resistance element, and determining an active negative isolation resistance term based upon the voltage across the second resistance element. In one embodiment, the second resistance element has a value of 6 Megohm. This includes determining the active positive isolation resistance term based upon the second bias resistance element and the second voltage between the negative power bus and ground; and determining the active negative isolation resistance term based upon the second bias resistance element and the second voltage between the negative power bus and ground.

The first positive isolation resistance term, the first negative isolation resistance, and the first voltage balance term are captured and stored (216). An overall absolute isolation resistance term is determined to be a minimum of the first positive isolation resistance term and the first negative isolation resistance.

The overall absolute isolation resistance term is evaluated by being compared to a minimum threshold absolute resistance value (218). In one embodiment, the minimum threshold absolute resistance value is determined as having a value of 500 ohms/volt. As such, in an embodiment of the DC power system 100 that has a bus voltage of 400V, a minimum threshold absolute resistance value may be calibrated to 200 Kohms.

When the overall absolute isolation resistance term is greater than the minimum threshold absolute resistance value (218)(0), an isolation fault is not indicated, and this iteration of the absolute isolation monitoring subroutine 210 ends (222).

When the overall absolute isolation resistance term is less than the minimum threshold absolute resistance value (218)(1), an isolation fault is indicated (220), and communicated to the controller for further action. This iteration of the absolute isolation monitoring subroutine 210 ends (222).

The dynamic isolation monitoring subroutine 230 periodically executes to determine and evaluate a dynamic isolation resistance term without regard to voltage or voltage balance conditions, i.e., without regard to variations in the positive bus voltage and/or the negative bus voltage. As such, the dynamic isolation monitoring subroutine 230 may execute when the variations in the power bus voltage are greater than the threshold value.

The dynamic isolation monitoring subroutine 230 periodically monitors the positive bus voltage and the negative bus voltage (232) and calculates a dynamic voltage balance term, which is a ratio between the positive bus voltage and the negative bus voltage.

The dynamic voltage balance is compared to the first voltage balance term, which was determined at step 213 (234).

When the dynamic voltage balance equals the first voltage balance term, the dynamic isolation resistance terms are set equivalent to the absolute isolation resistance values, i.e., the dynamic positive isolation resistance term (Riso+) is set equal to the first positive isolation resistance term, and the dynamic negative isolation resistance term (Riso−) is set equal to the first negative isolation resistance and stored (236).

When the dynamic voltage balance is less than the first voltage balance term, the dynamic isolation resistance terms are set as follows. The dynamic positive isolation resistance term (Riso+) is set equal to the first positive isolation resistance term multiplied by the dynamic voltage balance, and the dynamic negative isolation resistance term (Riso−) is set equal to the first negative isolation resistance (238). Alternatively, the dynamic positive isolation resistance term (Riso+) is set equal to the first positive isolation resistance divided by a ratio of the first voltage balance term and the dynamic voltage balance term.

When the dynamic voltage balance is greater than the first voltage balance term, the dynamic isolation resistance terms are set as follows. The dynamic positive isolation resistance term (Riso−) is set equal to the first positive isolation resistance term, and the dynamic negative isolation resistance term (Riso−) is set equal to the first negative isolation resistance divided by the dynamic voltage balance term (240). Alternatively, the dynamic negative isolation resistance term (Riso−) is set equal to the first negative isolation resistance divided by a ratio of the first voltage balance term and the dynamic voltage balance term.

The dynamic positive isolation resistance term (Riso+) and the dynamic negative isolation resistance term (Riso−) are reported out (242) and are evaluated by being compared with the minimum threshold absolute resistance value (244).

When both the dynamic positive isolation resistance term (Riso+) and the dynamic negative isolation resistance term (Riso−) are greater than the minimum threshold absolute resistance value (244)(0), an isolation fault is not indicated, and this iteration of the absolute isolation monitoring subroutine 210 ends (248).

When either of dynamic positive isolation resistance term or the dynamic negative isolation resistance term is less than the minimum threshold absolute resistance value (244)(1), an isolation fault is indicated (246), and communicated to the controller for further action. This iteration of the dynamic isolation monitoring subroutine 230 ends.

Presence or absence of isolation fault is communicated by the controller 60 to a malfunction indicator lamp 62, which serves to visually communicate occurrence of a fault to an operator. Detection of an isolation fault associated with the electrically-isolated power bus 20 for the DC power system 100 may lead to additional actions and interventions by the controller 60 to remediate the source of the fault, mitigate the source of the fault, or shutdown the DC power system 100.

The concepts described herein provide an absolute isolation resistance value with low computational overhead while being robust to high voltage bus noise. Furthermore, an absolute isolation resistance value may be rapidly estimated using a stored active isolation detection seed value taken when the vehicle is not under changing load, and manipulating it with instantaneous bus balance inputs. The concepts also result in the isolation detection being immune to bus voltage shifts that may occur.

The flowchart and block diagrams in the flow diagrams illustrate the architecture, functionality, and operation of possible implementations of systems, methods, and computer program products according to various embodiments of the present disclosure. In this regard, each block in the flowchart or block diagrams may represent a module, segment, or portion of code, which comprises one or more executable instructions for implementing the specified logical function(s). It will also be noted that each block of the block diagrams and/or flowchart illustrations, and combinations of blocks in the block diagrams and/or flowchart illustrations, may be implemented by dedicated-function hardware-based systems that perform the specified functions or acts, or combinations of dedicated-function hardware and computer instructions. These computer program instructions may also be stored in a computer-readable medium that can direct a computer or other programmable data processing apparatus to function in a particular manner, such that the instructions stored in the computer-readable medium produce an article of manufacture including instruction set that implements the function/act specified in the flowchart and/or block diagram block or blocks.

The detailed description and the drawings or figures are supportive and descriptive of the present teachings, but the scope of the present teachings is defined solely by the claims. While some of the best modes and other embodiments for carrying out the present teachings have been described in detail, various alternative designs and embodiments exist for practicing the present teachings defined in the appended claims.

What is claimed is:

1. A method for dynamically monitoring an electrically-isolated power bus for a DC power system, wherein the power bus includes a positive power bus and a negative power bus, the method comprising:
   dynamically monitoring voltage of the power bus;
   determining a variation in the voltage on the power bus;
   when the variation in the voltage on the power bus is less than a threshold variation:
      determining an active positive isolation resistance term associated with the positive power bus and ground,
      determining an active negative isolation resistance term associated with the negative power bus and ground, and
      determining a first voltage balance term based upon a ratio of the active positive isolation resistance term and the active negative isolation resistance term; and
   periodically determining a dynamic isolation resistance term, including:
      dynamically monitoring the voltage of the power bus;
      dynamically determining a voltage between the positive power bus and ground,
      dynamically determining a voltage between the negative power bus and ground, and determining a dynamic voltage balance term based upon a ratio of the voltage between the positive power bus and ground and the voltage between the negative power bus and ground;

determining, via the controller, a dynamic positive isolation resistance term based upon the active positive isolation resistance term and the dynamic voltage balance term;

determining, via the controller, a dynamic negative isolation resistance term based upon the active negative isolation resistance term and the dynamic voltage balance term; and detecting a fault associated with the power bus based upon the dynamic positive isolation resistance term and the dynamic negative isolation resistance term.

2. The method of claim 1, further comprising:
introducing a first bias resistance element between the positive power bus and ground;
determining a first voltage between the positive power bus and ground;
determining the active positive isolation resistance term based upon the first bias resistance element and the first voltage between the positive power bus and ground; and
determining the active negative isolation resistance term based upon the resistance and the first voltage between the positive power bus and ground.

3. The method of claim 1, further comprising:
introducing a second bias resistance element between the negative power bus and ground;
determining a second voltage between the positive power bus and ground;
determining the active positive isolation resistance term based upon the second bias resistance element and the second voltage between the negative power bus and ground; and
determining the active negative isolation resistance term based upon the second bias resistance element and the second voltage between the negative power bus and ground.

4. The method of claim 1, wherein determining the dynamic positive isolation resistance term based upon the active positive isolation resistance term and the dynamic voltage balance term comprises determining the dynamic positive isolation resistance term to be equal to the active positive isolation resistance term when the dynamic voltage balance term is equivalent to the first voltage balance term.

5. The method of claim 1, wherein determining the dynamic negative isolation resistance term based upon the active negative isolation resistance term and the dynamic voltage balance term comprises determining the dynamic negative isolation resistance term to be equal to the active negative isolation resistance term when the dynamic voltage balance term is equivalent to the first voltage balance term.

6. The method of claim 1, wherein determining the dynamic positive isolation resistance term based upon the active positive isolation resistance term and the dynamic voltage balance term comprises determining the dynamic positive isolation resistance term to be equal to the active positive isolation resistance term multiplied by the dynamic voltage balance term when the dynamic voltage balance term is less than the first voltage balance term.

7. The method of claim 1, wherein determining the dynamic negative isolation resistance term based upon the active negative isolation resistance term and the dynamic voltage balance term comprises determining the dynamic negative isolation resistance term to be equal to the active negative isolation resistance term when the dynamic voltage balance term is less than the first voltage balance term.

8. The method of claim 1, wherein determining the dynamic positive isolation resistance term based upon the active positive isolation resistance term and the dynamic voltage balance term comprises determining the dynamic positive isolation resistance term to be equal to the active positive isolation resistance term when the dynamic voltage balance term is greater than the first voltage balance term.

9. The method of claim 1, wherein determining the dynamic negative isolation resistance term based upon the active negative isolation resistance term and the dynamic voltage balance term comprises determining the dynamic negative isolation resistance term to be equal to the active negative isolation resistance term divided by the dynamic voltage balance term when the dynamic voltage balance term is greater than the first voltage balance term.

10. The method of claim 1, wherein determining the dynamic positive isolation resistance term based upon the active positive isolation resistance term and the dynamic voltage balance term further comprises determining the dynamic positive isolation resistance term to be equal to the active positive isolation resistance term multiplied by a ratio of the first voltage balance term and the dynamic voltage balance term when the dynamic voltage balance term is less than the first voltage balance term.

11. The method of claim 1, wherein determining the dynamic negative isolation resistance term based upon the active negative isolation resistance term and the dynamic voltage balance term further comprises determining the dynamic negative isolation resistance term to be equal to the active negative isolation resistance term divided by a ratio of the first voltage balance term and the dynamic voltage balance term when the dynamic voltage balance term is greater than the first voltage balance term.

12. The method of claim 1, further comprising communicating occurrence of the fault associated with the power bus to an operator via the controller.

13. The method of claim 1, wherein detecting the fault associated with the power bus based upon the dynamic positive isolation resistance term and the dynamic negative isolation resistance term comprises:
detecting the fault associated with the power bus when one of the dynamic positive isolation resistance term or the dynamic negative isolation resistance term is less than a minimum threshold resistance.

14. A DC power system, comprising:
a DC power source electrically coupled to an electric load via an electrically-isolated power bus, wherein the electrically-isolated power bus include a positive power bus and a negative power bus, wherein the positive power bus and the negative power bus are electrically isolated from a chassis ground;
a controller, in communication with the DC power source, the electrically-isolated power bus, and the electric load;
the controller including an instruction set, the instruction set executable to:
monitor voltage of the power bus;
determine a variation in the voltage on the power bus;
when the variation in the voltage on the power bus is less than a threshold variation:
introduce a first resistance between the positive power bus and ground, and coincidently determine a first voltage between the positive power bus and ground, determine an active positive isolation resistance term based upon the first resistance and the first voltage between the positive power bus and ground, introduce a second resistance between the negative power bus and ground, and coincidently determine a first voltage between the negative power bus and ground, determine an active negative isolation resistance term based upon the second resistance and the first voltage between the power bus and ground, and determine an absolute isolation resistance term as a minimum of the active positive isolation resistance term and the active negative isolation resistance term; and periodically determine a dynamic isolation resistance term, including:
  dynamically determine a second voltage between the positive power bus and ground,
  dynamically determine a second voltage between the negative power bus and ground,
  determine a dynamic voltage balance based upon the second voltage between the positive power bus and ground and the second voltage between the negative power bus and ground, and
  determine the dynamic isolation resistance term based upon the absolute isolation resistance term and the dynamic voltage balance; and detect a fault associated with the power bus based upon the absolute isolation resistance term and the dynamic isolation resistance term.

15. The DC power system of claim 14, wherein the instruction set executable to determine the active positive isolation resistance term associated with the positive power bus and ground comprises the instruction set executable to:
  introduce a resistance between the positive power bus and ground, and coincidently determining a first voltage between the positive power bus and ground; and
  determine the active positive isolation resistance term based upon the resistance and the first voltage between the positive power bus and ground.

16. The DC power system of claim 14, wherein the instruction set executable to determine the active negative isolation resistance term associated with the negative power bus and ground comprises the instruction set executable to:
  introduce a resistance between the negative power bus and ground, and coincidently determine a first voltage between the positive power bus and ground; and
  determine the active negative isolation resistance term based upon the resistance and the first voltage between the negative power bus and ground.

17. The DC power system of claim 14, wherein the instruction set executable to determine the dynamic isolation resistance term based upon the active positive isolation resistance term and the dynamic voltage balance comprises the instruction set executable to determine the dynamic isolation resistance term to be equal to the active positive isolation resistance term when the dynamic isolation resistance term is equivalent to the absolute isolation resistance term.

18. The DC power system of claim 14, wherein the instruction set executable to determine the dynamic isolation resistance term based upon the active negative isolation resistance term and the dynamic voltage balance comprises the instruction set executable to determine the dynamic negative isolation resistance term to be equal to the active negative isolation resistance term when the dynamic isolation resistance term is equivalent to the absolute isolation resistance term.

19. The DC power system of claim 14, wherein the instruction set executable to determine the dynamic positive isolation resistance term based upon the active positive isolation resistance term and the dynamic voltage balance term comprises the instruction set executable to determine the dynamic positive isolation resistance term to be equal to the active positive isolation resistance term multiplied by the dynamic voltage balance term when the dynamic isolation resistance term is less than the absolute isolation resistance term.

20. The DC power system of claim 14, further comprising the instruction set executable to communicate occurrence of the fault associated with the power bus to an operator via the controller.

* * * * *